(12) United States Patent
Kim et al.

(10) Patent No.: US 8,735,936 B2
(45) Date of Patent: May 27, 2014

(54) ORGANIC LIGHT EMITTING DIODE DISPLAY

(71) Applicant: Samsung Display Co., Ltd., Yongin (KR)

(72) Inventors: So-Yeon Kim, Yongin (KR); Sung-Wook Han, Yongin (KR); Dong-Won Han, Yongin (KR); Jin-Ho Kwack, Yongin (KR); Hyo-Jin Kim, Yongin (KR)

(73) Assignee: Samsung Display Co., Ltd., Gyeonggi-Do (KR)

(*) Notice: Subject to any disclaimer, the term of this patent is extended or adjusted under 35 U.S.C. 154(b) by 0 days.

(21) Appl. No.: 13/646,543

(22) Filed: Oct. 5, 2012

(65) Prior Publication Data

US 2013/0037792 A1 Feb. 14, 2013

Related U.S. Application Data

(62) Division of application No. 12/984,518, filed on Jan. 4, 2011, now abandoned.

(30) Foreign Application Priority Data

Jan. 4, 2010 (KR) .................. 10-2010-0000206

(51) Int. Cl.
*H01L 33/44* (2010.01)
*H01L 51/52* (2006.01)

(52) U.S. Cl.
USPC ........ 257/100; 257/40; 257/790; 257/E51.02; 257/E33.059; 313/512

(58) Field of Classification Search
CPC ............ H01L 51/5253; H01L 51/5256; H01L 51/5237
USPC .............. 257/40, 100, 787, 788, 790, E51.02, 257/E33.059, E23.116; 313/512
See application file for complete search history.

(56) References Cited

U.S. PATENT DOCUMENTS

| | | | |
|---|---|---|---|
| 5,757,126 | A | 5/1998 | Harvey, III et al. |
| 6,146,225 | A | 11/2000 | Sheats et al. |
| 6,268,659 | B1 | 7/2001 | Heubner et al. |
| 6,570,325 | B2 | 5/2003 | Graff et al. |

(Continued)

FOREIGN PATENT DOCUMENTS

| | | |
|---|---|---|
| CN | 101179092 A | 5/2008 |
| JP | 2001-338755 A | 12/2001 |

(Continued)

OTHER PUBLICATIONS

Machine English translation of KR10-2007/0107268 A.*

*Primary Examiner* — Yu Chen
(74) *Attorney, Agent, or Firm* — Knobbe, Martens, Olson & Bear, LLP (57) ABSTRACT

An organic light emitting diode (OLED) display is disclosed. In one embodiment, the OLED display includes an organic light emitting element formed over a substrate and an encapsulation portion covering the organic light emitting element. Further, the encapsulation portion may include at least one organic layer and at least one inorganic layer, wherein ends of the inorganic layer and the organic layer directly contact the substrate, and wherein the organic layer is thicker than the inorganic layer.

11 Claims, 5 Drawing Sheets

(56) References Cited

U.S. PATENT DOCUMENTS

| | | |
|---|---|---|
| 2005/0146267 A1 | 7/2005 | Lee et al. |
| 2008/0203907 A1 | 8/2008 | Lee et al. |
| 2009/0267487 A1 | 10/2009 | Kwack et al. |

FOREIGN PATENT DOCUMENTS

| | | |
|---|---|---|
| JP | 2006-140130 (A) | 6/2006 |
| JP | 2006-297737 (A) | 11/2006 |
| JP | 2007-118564 (A) | 5/2007 |
| JP | 2008-153004 (A) | 7/2008 |
| JP | 2008-218423 A | 9/2008 |
| JP | 2009-070696 (A) | 4/2009 |
| JP | 2009-158249 (A) | 7/2009 |
| JP | 2009-164107 (A) | 7/2009 |
| JP | 2009-252574 (A) | 10/2009 |
| JP | 2009-259788 (A) | 11/2009 |
| KR | 10-2004-0039608 (A) | 5/2004 |
| KR | 10-2006-0000747 (A) | 1/2006 |
| KR | 10-2006-0042728 (A) | 5/2006 |
| KR | 10-0730220 (B1) | 6/2007 |
| KR | 10-0759437 (B1) | 9/2007 |
| KR | 10-2007-0107268 (A) | 11/2007 |
| KR | 10-2007-0111002 (A) | 11/2007 |
| KR | 10-0777746 (B1) | 11/2007 |
| KR | 10-2008-0105308 (A) | 12/2008 |
| TW | 1222764 (B) | 10/2004 |
| TW | 1235976 (B) | 7/2005 |

* cited by examiner

ORGANIC LIGHT EMITTING DIODE DISPLAY

RELATED APPLICATIONS

This application is a divisional application of U.S. application Ser. No. 12/984,518, filed on Jan. 4, 2011, which is incorporated by reference in its entirety. Application Ser. No. 12/984,518 claimed priority to and the benefit of Korean Patent Application No. 10-2010-0000206 filed in the Korean Intellectual Property Office on Jan. 4, 2010, the entire contents of which are incorporated herein by reference.

BACKGROUND

1. Field

The described technology generally relates to an organic light emitting diode (OLED) display. More particularly, the described technology generally relates to an organic light emitting diode (OLED) display applied with a thin film encapsulation (TFE) structure.

2. Description of the Related Technology

An organic light emitting diode (OLED) display includes an organic light emitting element including a hole injection electrode (anode), an organic emission layer, and an electron injection electrode (cathode).

SUMMARY OF CERTAIN INVENTIVE ASPECTS

One aspect of the invention is an organic light emitting diode (OLED) display, having a thin film encapsulation layer, for protection from the ambient environment and suppressing deterioration of the organic light emitting element.

Another aspect is an organic light emitting diode (OLED) display which includes a substrate including an organic light emitting element, and an encapsulation portion covering the organic light emitting element and combined with the substrate. The encapsulation portion has a structure in which inorganic layers and organic layers are deposited, each end of the inorganic layers and the organic layers directly contact the substrate, and the organic layers are thicker than the inorganic layers.

One or more inorganic layers and organic layers may be provided, and they may be alternately deposited.

A first layer of the encapsulation portion disposed nearest the organic light emitting element and an n-th layer of the encapsulation portion disposed furthest from the organic light emitting element may be the inorganic layers.

An inorganic layer and an organic layer may form a sub-encapsulation portion as a pair, and n sub-encapsulation portions are deposited (only, n=2).

Among the n sub-encapsulation portions, the area of the inorganic layers of the n-th sub-encapsulation portion may be larger than the area of the inorganic layers of the (n−1)-th sub-encapsulation portion.

Among the n sub-encapsulation portions, the area of the organic layers of the n-th sub-encapsulation portion may be larger than the area of the organic layers of the (n−1)-th sub-encapsulation portion.

A photo-functional layer disposed between the organic light emitting element and the encapsulation portion may be further included, and the photo-functional layer may be an ultraviolet (UV) ray blocking layer.

The thickness of the photo-functional layer may be in the range of 20 to 200 nm, and the thickness of the photo-functional layer may be in the range of 40 to 150 nm.

The photo-functional layer may include one material selected from tris-8-hydroxyquinoline aluminum (Alq3), benzophenone, photoacryl, $BaF_2$, CsF, $Na_5Al_3F_{14}$, KCl, and $SiO_2$.

The photo-functional layer may be a reflective layer in which a first layer and a second layer having different refractive indexes are deposited.

The organic layers may be an ultraviolet (UV) hardening material, and the optical thickness of the first layer and the second layer is $\lambda/4$ of the wavelength of the ultraviolet (UV) used to harden the organic layers.

The first layer may include one material selected from tris-8-hydroxyquinoline aluminum (Alq3), benzophenone, photoacryl, $BaF_2$, CsF, $Na_5Al_3F_{14}$, KCl, and $SiO_2$.

The second layer may include one material selected from silicon nitride (SiN), $Cu_2O$, $Fe_2O_3$, $TiO_2$, and ZnSe.

The thickness of the organic layers may be at least five times the thickness of the inorganic layers. Another aspect is an organic light emitting diode (OLED) display comprising: an organic light emitting element formed over a substrate; and an encapsulation portion covering the organic light emitting element, wherein the encapsulation portion comprises at least one organic layer and at least one inorganic layer, wherein the organic layer has an end, wherein the inorganic layer has an end, wherein the ends of the inorganic layer and the organic layer directly contact the substrate, and wherein the organic layer is thicker than the inorganic layer.

In the above display, the encapsulation portion comprises a plurality of organic layers and a plurality of inorganic layers which are alternately formed with respect to the organic layers. In the above display, the encapsulation portion comprises a first layer formed nearest the organic light emitting element and an n-th layer formed farthest from the organic light emitting element, and wherein the first layer and n-th layer are formed of an inorganic material.

In the above display, one inorganic layer and one organic layer, contacting each other, form a sub-encapsulation portion in a pair, wherein the encapsulation portion comprises n sub-encapsulation portions, and wherein the n-th sub-encapsulation portion is farther from the organic light emitting element than the (n−1)-th sub-encapsulation portion. In the above display, the area of the inorganic layer of the n-th sub-encapsulation portion is larger than the area of the inorganic layer of the (n−1)-th sub-encapsulation portion.

In the above display, the area of the organic layer of the n-th sub-encapsulation portion is larger than the area of the organic layer of the (n−1)-th sub-encapsulation portion. The above display further comprises: a photo-functional layer interposed between the organic light emitting element and the encapsulation portion. In the above display, the photo-functional layer is an ultraviolet (UV) radiation blocking layer. In the above display, the thickness of the photo-functional layer is in the range of about 20 nm to about 200 nm.

In the above display, the thickness of the photo-functional layer is in the range of about 40 nm to about 150 nm. In the above display, the photo-functional layer is formed of at least one of the following: tris-8-hydroxyquinoline aluminum (Alq3), benzophenone, photoacryl, $BaF_2$, CsF, $Na_5Al_3F_{14}$, KCl, and $SiO_2$. In the above display, the photo-functional layer is a reflective layer which comprises a first layer and a second layer having different refractive indexes.

In the above display, the organic layer is formed of an ultraviolet (UV) hardening material, and wherein the optical thickness of the first layer and the second layer is about $\lambda/4$ of the wavelength of the ultraviolet (UV) radiation used to harden the organic layer. In the above display, the first layer is formed of at least one of the following: tris-8-hydroxyquinoline aluminum (Alq3), benzophenone, photoacryl, $BaF_2$, CsF, $Na_5Al_3F_{14}$, KCl, and $SiO_2$, and wherein the second layer is formed of at least one of the following: silicon nitride (SiN), $Cu_2O$, $Fe_2O_3$, $TiO_2$, and ZnSe. In the above display, the organic layer is at least five times thicker than the inorganic layer.

Another aspect is an organic light emitting diode (OLED) display comprising: an organic light emitting element formed over a substrate; and an encapsulation layer covering the organic light emitting element, wherein the encapsulation layer comprises a plurality of organic layers and a plurality of inorganic layers which are alternately formed with respect to the organic layers, wherein each of the organic layers has two opposing ends, wherein each of the inorganic layers has two opposing ends, wherein the ends of the organic layers and inorganic layers are non-linear and contact the substrate, and wherein one of the inorganic layers is formed nearest and directly contacts the organic light emitting element.

In the above display, the encapsulation layer comprises an inorganic layer which is farthest from the organic light emitting element. The above display further comprises a photo-functional layer interposed between the organic light emitting element and the encapsulation layer, wherein the photo-functional layer contacts the substrate and the ends of the organic layers and inorganic layers. In the above display, the thickness of the photo-functional layer is in the range of about 20 nm to about 200 nm. In the above display, the photo-functional layer has a non-linear portion which is formed adjacent to the ends of the organic layers and inorganic layers.

DETAILED DESCRIPTION OF CERTAIN INVENTIVE EMBODIMENTS

Generally, an organic light emitting element is provided on one substrate made of, for example, glass, and is covered by another substrate to prevent the deterioration of the element due to moisture and oxygen permeating from the environment.

Recently, there has been a tendency that the size and thickness of the OLED display panel decrease and the resolution increases according to a user's preferences. Further, a thin film encapsulation (TFE) layer is used to cover an organic light emitting element of the OLED device.

In the thin film encapsulation structure, at least each one of an organic layer or an inorganic layer is respectively and alternately deposited on the organic light emitting elements formed in the display area of the substrate, thereby covering the display area to protect the organic light emitting element. The deposited organic layer and inorganic layer are generally referred to as a thin film encapsulation layer.

Since the thin film encapsulation layer and substrate generally have a flexible characteristic, the OLED display including such flexible elements increases the flexibility of the entire device. Also, the use of a thin film encapsulation layer reduces the thickness of the OLED device. Further, OLED displays may be used across a variety of display applications (for example a folding-type).

However, OLED display technology generally has a weak encapsulation structure on the edge of the thin film encapsulation layer for the substrate such that the organic light emitting element is degraded by moisture and oxygen permeating from the environment.

Exemplary embodiments will be described more fully hereinafter with reference to the accompanying drawings, in which exemplary embodiments are shown. As those skilled in the art would realize, the described embodiments may be modified in various different ways, all without departing from the spirit or scope of the present invention.

Further, constituent elements having the same configurations in the exemplary embodiments are exemplarily described in a first exemplary embodiment using like reference numerals, and only different configurations from those in the first exemplary embodiment will be described in the other exemplary embodiments.

To clearly explain exemplary embodiments, portions having no connection to the explanation are omitted, and the same or similar constituent elements are designated the same reference numerals throughout the specification.

In the drawings, the size and thickness of each element is approximately shown for better understanding and ease of description. Therefore, the exemplary embodiment is not limited to the drawings.

In the drawings, the thickness of layers, films, panels, regions, etc., are exaggerated for clarity. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Figure 1:
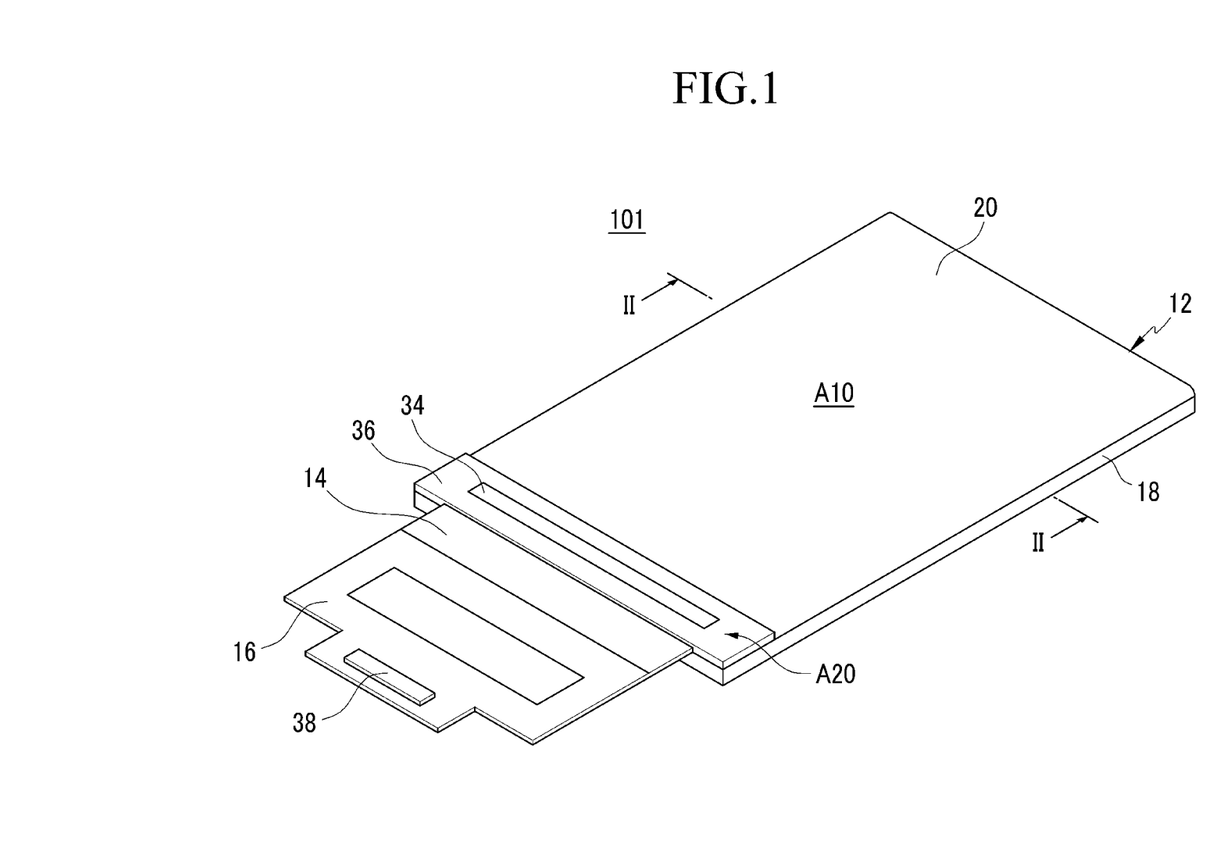
FIG. 1 is a perspective view of an organic light emitting diode (OLED) display according to the first exemplary embodiment.
Figure 2:
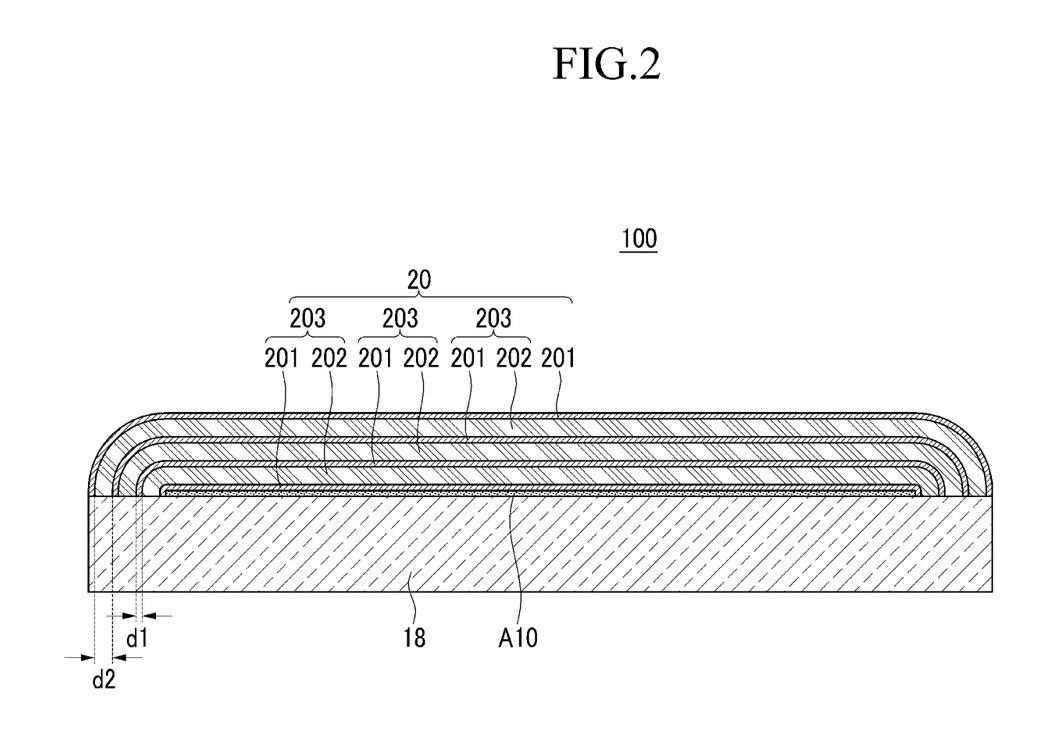
FIG. 2 is a cross-sectional view taken along the line II-II of FIG. 1.

FIG. 1 is a perspective view of an organic light emitting diode (OLED) display according to a first exemplary embodiment, and FIG. 2 is a cross-sectional view taken along the line II-II of FIG. 1.

Referring to FIG. 1 and FIG. 2, an organic light emitting diode display 101 includes i) a panel assembly 12, having a display area A10 and a pad area A20 and displaying a predetermined image at the display area A10, and ii) a printed circuit board 16 electrically connected to the panel assembly 12 via a flexible circuit board 14.

The panel assembly 12 includes a substrate 18 on the top surface of which the display area A10 and the pad area A20 are defined, and an encapsulation portion 20 formed on the substrate 18 such that it covers the display area A10. In one embodiment, the encapsulation portion 20 is greater in area than the display area A10, and covers the display area A10 and the top surface of the substrate 18 external to the display area A10 to protect them. In one embodiment, the pad area A20 is not covered by the encapsulation portion 20, and is exposed to the environment.

In one embodiment, the sub-pixels are arranged at the display area A10 of the substrate 18 in the form of a matrix, and a scan driver (not shown) and a data driver (not shown) are placed external to the display area A10 in order to drive the sub-pixels. Pad electrodes (not shown) may be located at the pad area A20 of the substrate 18 to transmit electrical signals to the scan driver and the data driver.

Figure 3:
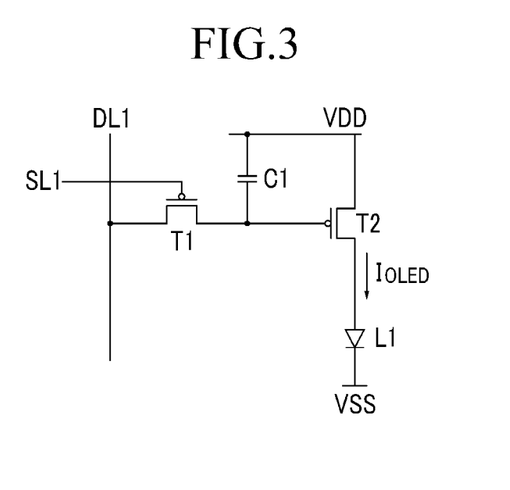
FIG. 3 is a schematic diagram of a sub-pixel circuit structure of the panel assembly shown in FIG. 1.
Figure 4:
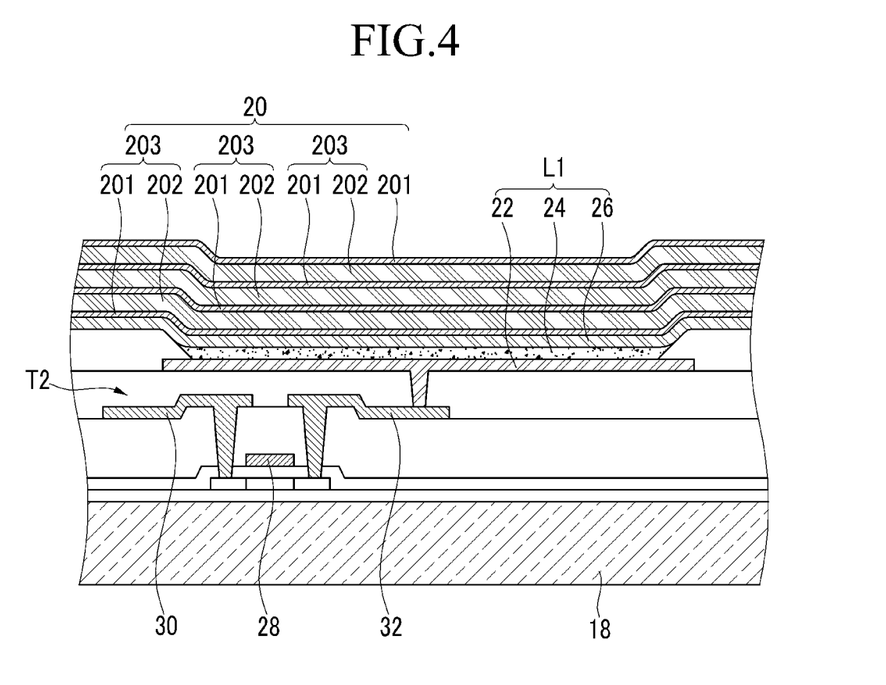
FIG. 4 is a partial enlarged cross-sectional view of the panel assembly of FIG. 1.

FIG. 3 is a schematic diagram of a sub-pixel circuit structure of the panel assembly shown in FIG. 1, and FIG. 4 is a partial enlarged cross-sectional view of the panel assembly of FIG. 1.

Referring to FIG. 3 and FIG. 4, the sub-pixel of the panel assembly 12 is formed with an organic light emitting diode L1, and a driving circuit unit. The organic light emitting diode L1 includes a first pixel electrode (or a hole injection electrode (anode)) 22, an organic emissive layer 24, and a second pixel electrode (or an electron injection electrode (cathode)) 26.

The organic emissive layer 24 may further include an emission layer (not shown) for practically emitting light, and organic layers (not shown) for effectively transferring carriers of holes or electrons to the emission layer. The organic layers may include a hole injection layer (HIL) and a hole transport layer (HTL) interposed between the first pixel electrode 22 and the emission layer, and an electron injection layer (EIL) and an electron transport layer (ETL) interposed between the second pixel electrode 26 and the emission layer.

In one embodiment, the driving circuit unit includes at least two thin film transistors T1 and T2, and at least one storage capacitor C1. The thin film transistor basically includes a switching transistor T1 and a driving transistor T2.

The switching transistor T1 is connected to the scan line SL1 and the data line DL1, and transmits the data voltages input into the data line DL1 to the driving transistor T2 in accordance with the switching voltages input to the scan line SL1. The storage capacitor C1 is connected to the switching transistor T1 and the power supply line VDD, and stores a voltage with a value corresponding to a difference between the voltage transmitted from the switching transistor T1 and the voltage supplied to the power supply line VDD.

The driving transistor T2 is connected to the power supply line VDD and the storage capacitor C1 to supply an output current IOLED that is proportional to the square of the difference between the voltage stored at the storage capacitor C1 and the threshold voltage to the organic light emitting diode L1. The organic light emitting diode L1 emits light by way of the output current IOLED. The driving transistor T2 includes a gate electrode 28, a source electrode 30, and a drain electrode 32. The first pixel electrode 22 of the organic light emitting diode L1 may be connected to the drain electrode 32 of the driving transistor T2. The structure of the sub-pixel is not limited to as above-described, but may be altered in various manners.

Referring to FIG. 1, an integrated circuit chip 34 is mounted on the pad area A20 of the panel assembly 12 as a chip-on-glass type, and a flexible circuit board 14 is mounted thereon as a chip-on-film type. A protective layer 36 is formed around the integrated circuit chip 34 and the flexible circuit board 14 so as to cover and protect the pad electrodes formed at the pad area A20. Electronic devices (not shown) are mounted on the printed circuit board 16 to process the driving signals, and a connector 38 is installed thereon to transmit the external signals to the printed circuit board 16.

A shock absorbing tape (not shown) or bezel (not shown) may be provided at the back side of the panel assembly 12 to increase the impact resistance of the panel assembly 12. In one embodiment, the flexible circuit board 14 is folded to the back side of the panel assembly 12 such that the printed circuit board 16 faces the rear surface of the panel assembly 12.

In one embodiment, the encapsulation portion 20 is directly formed on the organic light emitting diodes and the driving circuit units of the substrate 18 so as to seal and protect them from the outside. This encapsulation portion 20 may be made of a thin film, and is referred to as a thin film encapsulation layer.

In one embodiment, the thin film encapsulation layer 20 is formed with at least one inorganic layer 201 and at least one organic layer 202, which are alternately deposited one by one. In the deposition structure, a pair of an inorganic layer 201 and an organic layer 202 forms a sub-encapsulation portion 203, and the sub-encapsulation portion 203 may have the deposition number of n (only, n=2).

In one embodiment, the encapsulation portion 20 includes the sub-encapsulation portions 203 having a deposition number of three. That is, three inorganic layers 201 and three organic layers 202 are alternately deposited. For example, an inorganic layer 201 covering the organic light emitting element L1 is coated (or formed) on the substrate 18, an organic layer 202 is coated thereon, another inorganic layer 201 is coated thereon, and another organic layer 202 is coated thereon, and an inorganic layer 201 is finally coated on the uppermost organic layer 202 thereby forming the encapsulation portion 20. In this embodiment, the first layer covering the organic light emitting element L1 and disposed nearest the organic light emitting element L1 and the final layer (n-th layer) disposed farthest from the organic light emitting element L1 and positioned outermost of the encapsulation portion 20 for the display area A10 are inorganic layers. In another embodiment, the stacking order and the number (e.g., 4 or more, or 2 or less) of organic and inorganic layers may be modified in various ways, as long as the organic layers 202 and inorganic layers 201 are alternately formed.

The inorganic layers 201 may be made of a metallic oxide or nitride through sputtering, CVD, or ion beam assisted deposition (IBAD). For example, the inorganic layer 201 may be made of a material selected from at least one of: calcium oxide, alumina, silica, titania, indium oxide, tin oxide, silicon oxide, silicon nitride, and aluminum nitride, but is not limited thereto.

The organic layers 202 may be formed through a process in which a liquid or an evaporated monomer is deposited and then baked through irradiation of ultraviolet (UV) rays. An example of a material thereof may be made of one selected from acrylic, methacrylic, polyester, PET, polyethylene, polypropylene, or a mixture thereof.

In one embodiment, the thickness of the inorganic layers 201 differs from that of the organic layers 202. In one embodiment, the thickness of the organic layers 202 (d2) is greater than the thickness of the inorganic layers 201 (d1). For example, the thickness d2 may be about five times greater than the thickness d1. As another example, the thickness d2 may be less than about five times or greater than about five times the thickness d1. This thickness relationship of the inorganic layers 201 and the organic layers 202 may be equally maintained for the display area and the non-display area of the substrate 18.

In one embodiment, as shown in FIG. 2, the end portions of each inorganic layer 201 and each organic layer 202 directly contact the substrate 18. Since all of the end portions contact the substrate 18, the thin film encapsulation layer 20 can more effectively prevent permeation of moisture or oxygen through a side of the organic light emitting element L1.

The thickness d1 of the inorganic layers 201 may be about 100 nm, and the thickness d2 of the organic layers 202 may be about 500 nm. In another embodiment, the thickness d1 of the inorganic layers 201 may be less than about 100 nm, and the thickness d2 of the organic layers 202 may be greater than about 500 nm.

In one embodiment, the area of the organic layers included in the n-th sub-encapsulation portion is larger than the area of the organic layers included in the (n−1)-th sub-encapsulation portion, and the area of the inorganic layers included in the n-th sub-encapsulation portion is also larger than the area of the inorganic layers included in the (n−1)-th sub-encapsulation portion.

Figure 5:
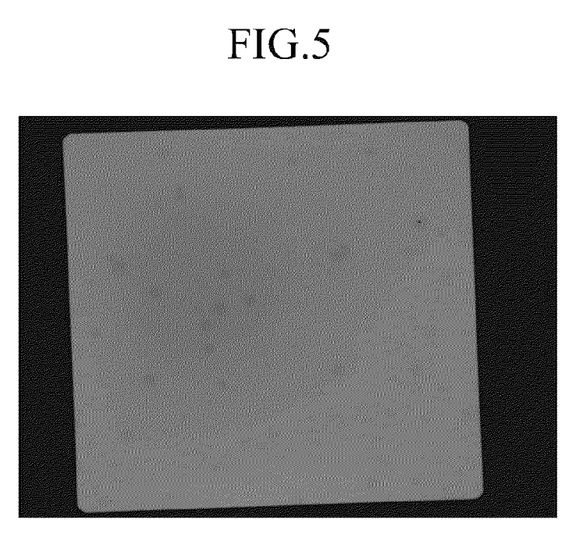
FIG. 5 is a photograph showing an organic light emitting diode (OLED) display according to an exemplary embodiment.
Figure 6:
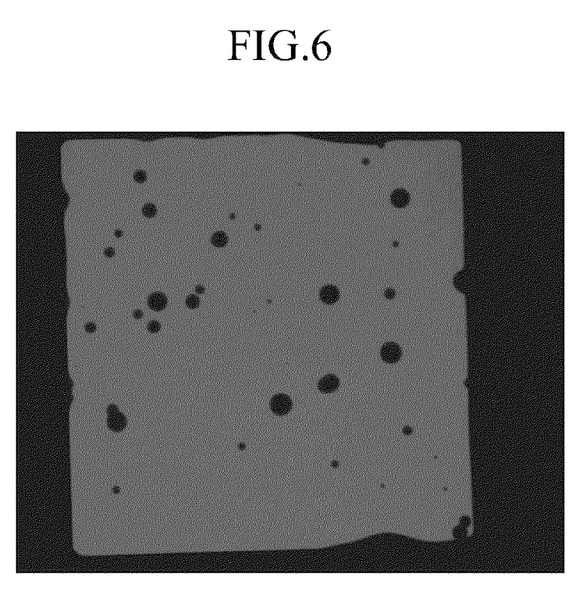
FIG. 6 is a photograph showing an organic light emitting diode (OLED) display according to a comparative example.

FIG. 5 is a photograph showing an organic light emitting diode (OLED) display according to one embodiment, and FIG. 6 is a photograph showing an organic light emitting diode (OLED) display according to a comparative example.

In the comparative example, the thickness of the inorganic layers of the encapsulation portion is 100 nm and the thickness of the organic layers is 70 nm which is thinner than the thickness of the inorganic layers. The other conditions such as the condition that the ends of the inorganic layers and the organic layers directly contact the substrate are the same as these of the exemplary embodiment.

FIG. 5 and FIG. 6 respectively show the results after leaving the OLED devices according to one embodiment and the comparative example for 300 hours in an atmosphere of a high temperature of 85 degrees and a high relative humidity of 85%.

As can be appreciated from FIGS. 5 and 6, one inventive embodiment shown in FIG. 5 is advantageous over the comparative example shown in FIG. 6 in that black points or spots are not or significantly less generated in the FIG. 5 embodiment. Therefore, the life-span or the efficiency characteristics may be significantly improved.

According to one embodiment, the overall thickness of the encapsulation portion is uniform and the encapsulation portion is dense, and thereby the pollution material or the moisture may be prevented beforehand from penetrating from the outside of the organic light emitting diode (OLED) display.

Furthermore, in one embodiment, all ends of the inorganic layers and the organic layers directly contact the substrate when forming the encapsulation portion such that undesirable materials that may penetrate into the interface between the substrate and the encapsulation portion may be further effectively prevented.

Figure 7:
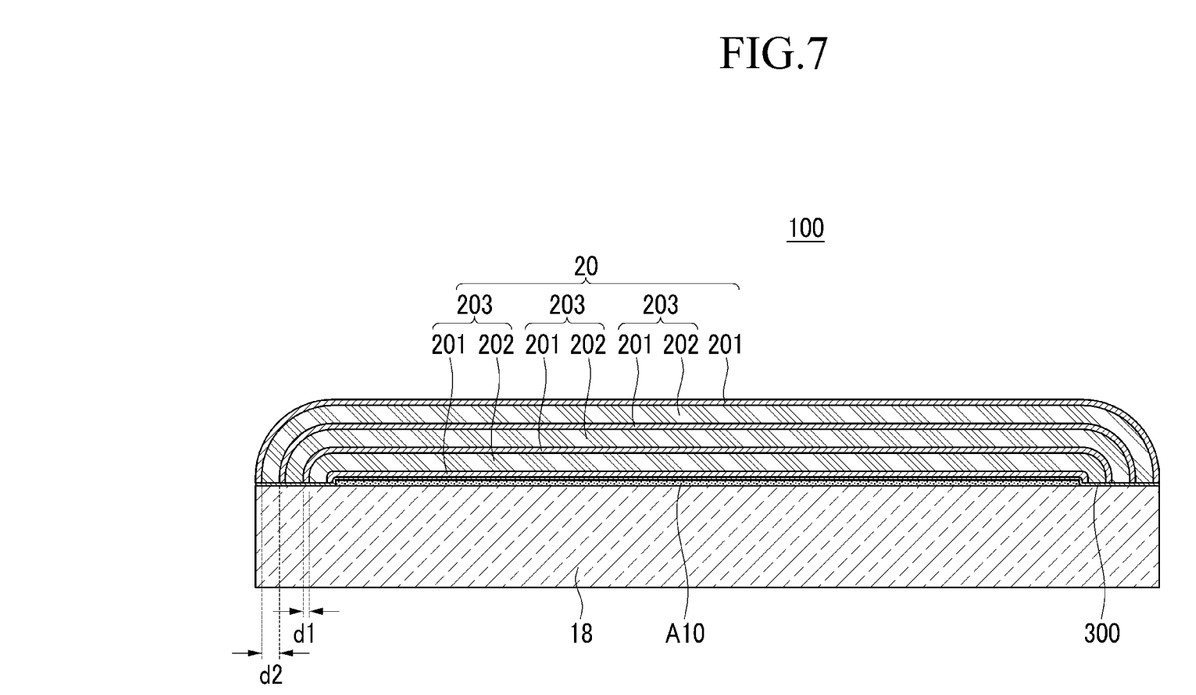
FIG. 7 is a cross-sectional view of an organic light emitting diode (OLED) display according to the second exemplary embodiment.

FIG. 7 is a cross-sectional view of an organic light emitting diode (OLED) display according to a second exemplary embodiment. As shown, the organic light emitting diode (OLED) display has the same basic structure as that of the organic light emitting diode (OLED) display according to the first exemplary embodiment, and further includes a photo-functional layer 300 formed between the encapsulation portion 20 and the organic light emitting element L1.

The photo-functional layer 300 may be made of an ultraviolet (UV) blocking layer to block the ultraviolet (UV) radiation that adversely affects the organic light emitting element L1. The photo-functional layer 300 may be made as a single layer, however it may be formed as a multiple-layered structure including at least two layers. The thickness of the photo-functional layer 300 may be maintained in the range from about 20 nm to about 200 nm. The above range may be beneficial in terms of protection of the organic light emitting element L1, the light extraction efficiency rate of the OLED display or the color purity characteristic. Further, it may be beneficial to have the thickness of the photo-functional layer in the range of about 50 nm to about 150 nm, in terms of enhanced efficiency characteristic of the OLED display. However, the thickness of the photo-functional layer 300 may be less than about 20 nm or greater than about 200 nm depending on the embodiment.

The photo-functional layer 300 may be made of a material including at least one selected from tris-8-hydroxyquinoline aluminum (Alq3), benzophenone, photoacryl, $BaF_2$, CsF, $Na_5Al_3F_{14}$, KCl, and $SiO_2$.

On the other hand, when the photo-functional layer 300 is made of the multi-layered structure, the substantial configuration may have a reflective layer structure in which the first layer and the second layer having different refractive indexes are deposited.

Each optical thickness of the first layer and the second layer may have about $\lambda/4$ of the wavelength of the ultraviolet (UV) radiation used to harden the organic layers 202 when the organic layers 202 of the encapsulation portion 20 is made of material which can be hardened by ultraviolet (UV) radiation.

As an example of the material of the first layer and the second layer, the first layer may include at least one of: tris-8-hydroxyquinoline aluminum (Alq3), benzophenone, photoacryl, $BaF_2$, CsF, $Na_5Al_3F_{14}$, KCl, and $SiO_2$, and the second layer may include at least one of: silicon nitride (SiN), $Cu_2O$, $Fe_2O_3$, $TiO_2$, and ZnSe.

According to at least one embodiment, the organic light emitting diode (OLED) display may effectively block undesirable materials permeating from the environment. Accordingly, block points and the spots may be prevented beforehand such that the product characteristics may be improved and the life-span may be extended.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode (OLED) display comprising:
   an organic light emitting element formed over a substrate;
   an encapsulation portion covering the organic light emitting element, wherein the encapsulation portion comprises a plurality of organic layers and a plurality of inorganic layers, and wherein each of the organic layers is thicker than each of the inorganic layers; and
   a photo-functional layer interposed between the organic light emitting element and the encapsulation portion, wherein each end of each of the organic layers and each of the inorganic layers directly contacts the photo-functional layer.

2. The OLED display of claim 1, wherein the photo-functional layer is an ultraviolet (UV) radiation blocking layer.

3. The OLED display of claim 2, wherein the thickness of the photo-functional layer is in the range of about 20 nm to about 200 nm.

4. The OLED display of claim 3, wherein the thickness of the photo-functional layer is in the range of about 40 nm to about 150 nm.

5. The OLED display of claim 2, wherein the photo-functional layer is formed of at least one of the following: tris-8-hydroxyquinoline aluminum (Alq3), benzophenone, photoacryl, $BaF_2$, CsF, $Na_5Al_3F_{14}$, KCl, and $SiO_2$.

6. The OLED display of claim 1, wherein the photo-functional layer is a reflective layer which comprises a first layer and a second layer having different refractive indexes.

7. The OLED display of claim 6, wherein the organic layers are formed of an ultraviolet (UV) hardening material, and wherein the optical thickness of the first layer and the second layer is about λ/4 of the wavelength of the ultraviolet (UV) radiation used to harden the organic layers.

8. The OLED display of claim 6, wherein the first layer is formed of at least one of the following: tris-8-hydroxyquinoline aluminum (Alq3), benzophenone, photoacryl, $BaF_2$, CsF, $Na_5Al_3F_{14}$, KCl, and $SiO_2$, and wherein the second layer is formed of at least one of the following: silicon nitride (SiN), $Cu_2O$, $Fe_2O_3$, $TiO_2$, and ZnSe.

9. An organic light emitting diode (OLED) display comprising:
   an organic light emitting element formed over a substrate;
   an encapsulation layer covering the organic light emitting element; and
   a photo-functional layer interposed between the organic light emitting element and the encapsulation layer, wherein the photo-functional layer contacts the substrate,
   wherein the encapsulation layer comprises a plurality of organic layers and a plurality of inorganic layers which are alternately formed with respect to the organic layers, wherein each of the organic layers has two opposing ends, wherein each of the inorganic layers has two opposing ends, wherein the ends of the organic layers and inorganic layers are non-linear and directly contact the photo-functional layer, and wherein one of the inorganic layers is formed nearest the organic light emitting element and directly contacts the photo-functional layer.

10. The OLED display of claim 9, wherein the thickness of the photo-functional layer is in the range of about 20 nm to about 200 nm.

11. The OLED display of claim 9, wherein the photo-functional layer has a non-linear portion which is formed adjacent to the ends of the organic layers and inorganic layers.

* * * * *